United States Patent
Kusunose et al.

(10) Patent No.: US 9,638,739 B2
(45) Date of Patent: May 2, 2017

(54) DEFECT COORDINATES MEASUREMENT DEVICE, DEFECT COORDINATES MEASUREMENT METHOD, MASK MANUFACTURING METHOD, AND REFERENCE MASK

(71) Applicant: Lasertec Corporation

(72) Inventors: Haruhiko Kusunose, Yokohama (JP); Hiroki Miyai, Yokohama (JP)

(73) Assignee: Lasertec Corporation, Yokohama (JP)

( * ) Notice: Subject to any disclaimer, the term of this patent is extended or adjusted under 35 U.S.C. 154(b) by 653 days.

(21) Appl. No.: 13/791,537

(22) Filed: Mar. 8, 2013

(65) Prior Publication Data
US 2013/0245971 A1 Sep. 19, 2013

(30) Foreign Application Priority Data
Mar. 14, 2012 (JP) ................................. 2012-057168

(51) Int. Cl.
*G01R 31/26* (2014.01)
*G03F 7/20* (2006.01)
*G03F 1/84* (2012.01)

(52) U.S. Cl.
CPC .............. *G01R 31/26* (2013.01); *G03F 1/84* (2013.01); *G03F 7/7065* (2013.01); *G03F 7/7085* (2013.01); *G03F 7/70483* (2013.01)

(58) Field of Classification Search
CPC .... G01R 31/26; G01R 31/2601; G01R 31/26; G01R 31/01; G03F 7/70483; G03F 7/7085; G03F 7/7065; G03F 1/84; G03F 3/06; G01N 21/956
USPC ........................................................ 702/59
See application file for complete search history.

(56) References Cited

U.S. PATENT DOCUMENTS

| 7,911,600 B2 * | 3/2011 | Terasawa et al. .......... 356/237.5 |
| 2012/0198404 A1 * | 8/2012 | Hasebe ........................ 716/112 |

FOREIGN PATENT DOCUMENTS

| JP | 2005-050851 A | 2/2005 |
| JP | 2011-009662 A | 1/2011 |

* cited by examiner

*Primary Examiner* — Jonathan C Teixeira Moffat
*Assistant Examiner* — Lynda Dinh
(74) *Attorney, Agent, or Firm* — Maier & Maier, PLLC

(57) ABSTRACT

A defect coordinates measurement method includes a step of detecting detected coordinates of a fiducial mark and a defect of a mask blank placed on support pins, a step of detecting detected coordinates of the alignment mark of a reference mask placed on the support pins, a step of extracting a reference mark near the detected coordinates of the defect among the plurality of reference marks based on the detected coordinates of the defect of the mask blank and the alignment mark of the reference mask, a step of detecting detected coordinates of the extracted reference mark, and a step of calculating coordinates of the defect based on the detected coordinates of the reference mark and the detected coordinates of the defect.

9 Claims, 8 Drawing Sheets

# DEFECT COORDINATES MEASUREMENT DEVICE, DEFECT COORDINATES MEASUREMENT METHOD, MASK MANUFACTURING METHOD, AND REFERENCE MASK

RELATED APPLICATION

This application claims priority wider 35 U.S.C. §119 to Japanese Patent Application No. JP2012-057168 filed Mar. 14, 2012, the disclosure of which is incorporated by reference herein in its entirety.

BACKGROUND OF THE INVENTION

1. Field of the Invention

The present invention relates to a defect coordinates measurement device, a defect coordinates measurement method, a mask manufacturing method, and a reference mask.

2. Description of Related Art

When forming a fine pattern in an EUVL (Extreme UltraViolet Lithography) mask or the like, an alignment mark (fiducial mark) is used for the alignment (Japanese Unexamined Patent Application Publication No. 2005-50851). In the technique disclosed in Japanese Unexamined Patent Application Publication No. 2005-50851, a cross alignment mark is formed by cutting a groove on a substrate and depositing chromium oxide into the groove.

In a manufacturing process of a semiconductor device, if a mask defect is printed onto the semiconductor device, conduction or short-circuit of wires occurs, which results in a defective item. Japanese Unexamined Patent Application Publication No. 2011-9662 discloses a technique of detecting a defect by forming a grid on the backside of an element formation surface of a semiconductor substrate.

In the case of implementing defect mitigation in EUVL, the total tolerance of the alignment is 20 nm, for example. Thus, it is necessary to detect a defect highly accurately. However, when detecting a defect, various errors are present in measurement results. The errors include an offset error and rotation error when placing a sample on a stage, the orthogonality and straightness of a stage, a magnification error and the like, for example.

Further, the distortion of straightness of a stage can be corrected by a polynomial approximation. In this case, by using higher-order terms in a polynomial approximate expression, the accuracy can be enhanced. However, in actual measurements, not only a low-order offset error and rotation error but also a high frequency component such as a white noise occurs. Thus, the polynomial approximation causes an error to be raised at the end of a mask, which decreases the accuracy.

Further, in order to reduce an error in stage coordinates to be 20 nm or less, there is a problem of temperature stability or the like. To maintain the coordinate accuracy for a long time, costs increase because of an increase in device size due to a temperature stabilization mechanism and use of a low thermal expansion material. There is thus a problem that the measurement accuracy of defect coordinates decreases with a simple device configuration and a coordinate system calibration method.

The present invention has been accomplished to solve the above problems and an object of the present invention is thus to provide a defect coordinates measurement device capable of highly accurate measurement, a defect coordinates measurement method, a mask manufacturing method, and a reference mask.

SUMMARY OF THE INVENTION

According to a first aspect of the present invention, there is provided a defect coordinates measurement device including a placement unit on which a sample is placed, a detection unit that detects coordinates of a mark and a defect formed on a sample placed on the placement unit, and a processing unit that measures coordinates of a defect of a test sample based on coordinates of a mark and a defect detected by the detection unit, wherein the defect coordinates measurement device detects detected coordinates of a fiducial mark and a defect of the test sample placed on the placement unit, places a reference sample on which a plurality of reference marks whose positions relative to an alignment mark are known are arranged onto the placement unit, and detects detected coordinates of the alignment mark, extracts a reference mark near the detected coordinates of the defect among the plurality of reference marks based on the detected coordinates of the defect and the alignment mark, detects detected coordinates of the extracted reference mark, and calculates coordinates of the defect based on the detected coordinates of the reference mark and the detected coordinates of the defect. It is thereby possible to detect the defect highly accurately.

According to a second aspect of the present invention, the above-described defect coordinates measurement device calculates the coordinates of the defect by converting the detected coordinates of the defect into coordinates in a reference sample coordinate system for the reference sample by using the detected coordinates of the defect and the detected coordinates of the reference mark. It is thereby possible to accurately measure the coordinates of the defect in the reference sample coordinate system.

According to a third aspect of the present invention, the above-described defect coordinates measurement device extracts N (N is an integer of two or more) number of reference marks nearest to the defect and detects coordinates of the reference marks. Therefore, even when there is a defect in the reference sample, it is possible to prevent error detection of the coordinates and thereby achieve accurate measurement.

According to a fourth aspect of the present invention, in the above-described defect coordinates measurement device, the reference marks are arranged at regular intervals in each of two orthogonal directions. This facilitates measurement.

According to a fifth aspect of the present invention, there is provided a defect coordinates measurement method including a step of detecting detected coordinates of a fiducial mark and a defect of a test sample placed on a placement unit, a step of placing a reference sample on which a plurality of reference marks whose positions relative to an alignment mark are known are arranged onto the placement unit, a step of detecting detected coordinates of the alignment mark of the reference sample placed on the placement unit, a step of extracting a reference mark near the detected coordinates of the defect among the plurality of reference marks based on the detected coordinates of the defect and the alignment mark, a step of detecting detected coordinates of the extracted reference mark, and a step of calculating coordinates of the defect based on the detected coordinates of the reference mark and the detected coordinates of the defect. It is thereby possible to detect the defect highly accurately.

According to a sixth aspect of the present invention, the above-described defect coordinates measurement method calculates the coordinates of the defect by converting the detected coordinates of the defect into coordinates in a reference sample coordinate system for the reference sample by using the detected coordinates of the defect and the detected coordinates of the reference mark. It is thereby possible to accurately measure the coordinates of the defect in the reference sample coordinate system.

According to a seventh aspect of the present invention, the above-described defect coordinates measurement method extracts N (N is an integer of two or more) number of reference marks nearest to the defect and detects coordinates of the reference marks. Therefore, even when there is a defect in the reference sample, it is possible to prevent error detection of the coordinates and thereby achieve accurate measurement.

According to an eighth aspect of the present invention, in the above-described defect coordinates measurement method, the reference marks are arranged at regular intervals in each of two orthogonal directions. This facilitates measurement.

According to a ninth aspect of the present invention, there is provided a mask manufacturing method including a step of measuring defect coordinates using the above-described defect coordinates measurement method, and a step of forming a pattern on a mask blank so that the pattern is formed above the measured defect coordinates. It is thereby possible to reduce the effect of the defect.

According to a tenth aspect of the present invention, in the above-described mask manufacturing method, the pattern is formed on the mask blank using a pattern drawing system that forms the reference marks on the reference mask. The pattern formation error is thereby reduced, and it is thereby possible to reliably reduce the effect of the defect.

According to an eleventh aspect of the present invention, in the above-described mask manufacturing method, the mask includes a multilayer film that reflects EUV light, and an absorber that is placed on the multilayer film and absorbs EUV light, and all defects are placed directly below patterns of the absorber. It is thereby possible to reliably prevent the defect from being printed.

According to a twelfth aspect of the present invention, there is provided a reference mask used for measurement of defect coordinates of a test mask, the reference mask having a plurality of alignment marks and a plurality of reference marks arranged in an array at regular intervals within the plurality of alignment marks. In this structure, it is possible to perform highly accurate defect measurement.

According to the above aspects of the present invention, it is possible to provide a defect coordinates measurement device capable of highly accurate measurement, a defect coordinates measurement method, a mask manufacturing method, and a reference mask.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

Preferred embodiments of the present invention will be described hereinbelow with reference to the drawings. The explanation provided hereinbelow merely illustrates preferred embodiments of the present invention, and the present invention is not limited to the below-described embodiments. In the following description, the identical reference symbols denote identical structural elements and the redundant explanation thereof is omitted.

A defect coordinates measurement device according to an embodiment converts the detected coordinates of a defect of a test sample detected by a defect inspection device into the coordinate system of a reference sample. The reference sample is a sample having reference marks and alignment marks whose coordinates are known. The coordinates of the reference marks and the alignment marks are detected by a reference coordinates measurement machine, for example. Thus, the coordinates of the reference marks and the alignment marks in the reference sample are known. Then, the stage coordinate system of the defect inspection device is converted into the coordinate system of the reference sample.

Although an EUVL mask blank (which is also referred to as mask blanks) is used as an example of the test sample, a sample that is measured by the defect coordinates measurement device according to the embodiment is not particularly limited.

First Embodiment

Figure 1:
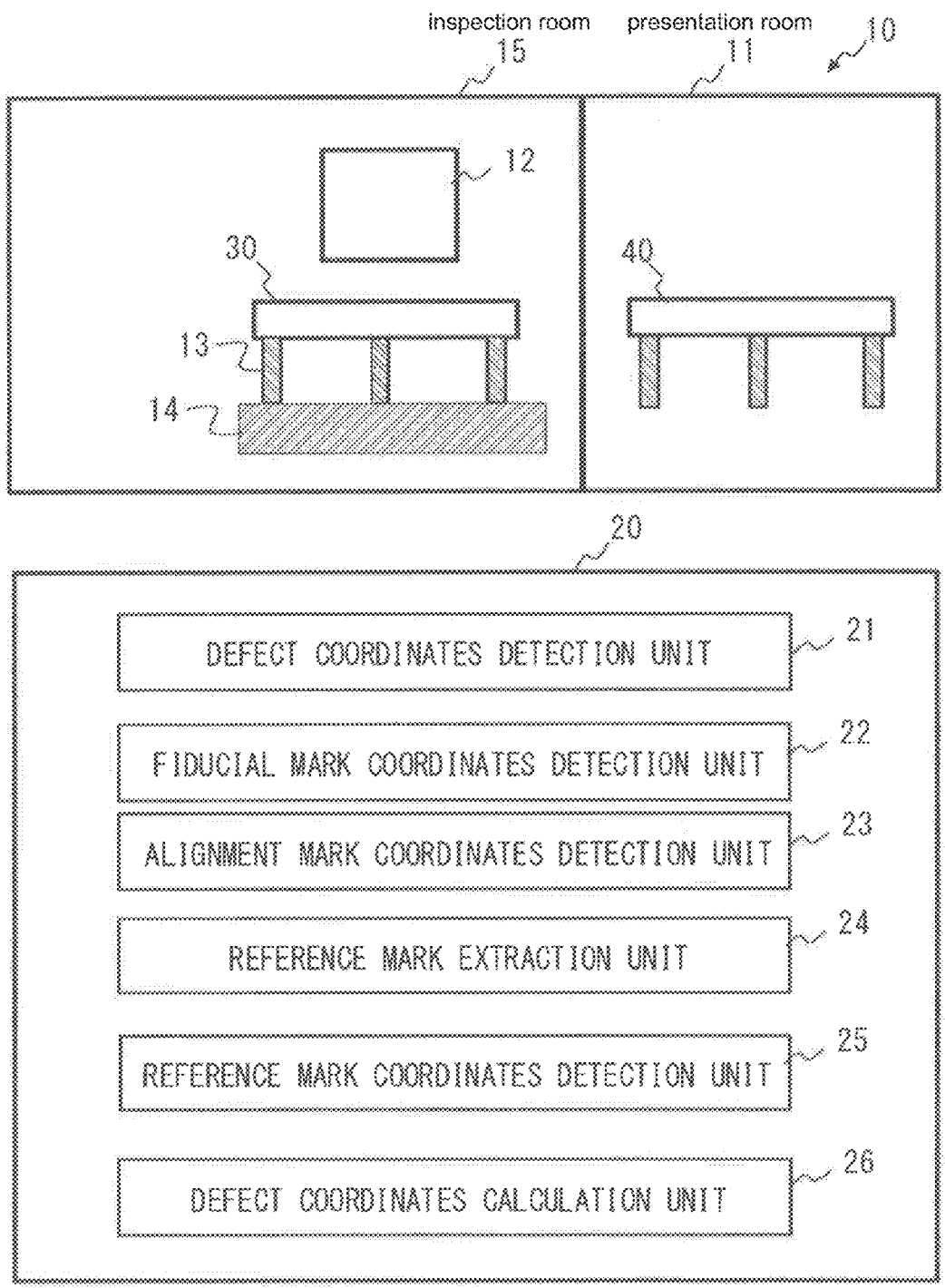
FIG. 1 is a view schematically showing a configuration of a defect coordinates measurement device according to an embodiment.

The configuration of the defect coordinates measurement device is described hereinafter with reference to FIG. 1. The defect coordinates measurement device includes an inspection device 10 and a processing device 20. The inspection device 10 has a preparation room 11 and an inspection room 15. In the inspection room 15, a detection unit 12, support pins 13, and a movable stage 14 are placed. The support pins 13 serve as a placement unit on which a mask blank 30 is placed. In this example, the mask blank 30 is placed on three support pins 13 which are not collinear. By supporting the mask blank 30, which is a test sample, at three points, it is possible to prevent the distortion of the mask blank 30 due to clamping or the like. Further, the deformation of the mask blank 30 is reproduced. Thus, the reproducibility is high, which enables highly accurate measurement. The movable stage 14 is an XY stage and moves the support pins 13 horizontally. The mask blank 30 thereby moves horizontally.

The detection unit 12 is located above the mask blank 30 that is placed on the support pins 13. The detection unit 12 has a light source, a mirror, a photodetector and the like and captures an image of the mask blank 30 that is supported by the support pins 13. Light from the light source is guided to the mask blank 30 using the mirror or the like, and the light scattered from a defect of the mask blank 30 is detected by a camera or the like. The detection unit 12 optically detects the scattered light.

Then, when the movable stage 14 moves, the relative positions of the mask blank 30 and the detection unit 12 change. The detection unit 12 and the mask blank 30 can move relatively to each other by the movable stage 14, so that the whole area of the mask blank 30 can be inspected. For example, by moving the movable stage 14, an illuminating position and an imaging position in the detection unit 12 move. It is thereby possible to capture the whole image of the mask blank 30. As a matter of course, the detection unit 12 may move, and scanning by a scanning mirror or the like may be used. The whole area inspection may be performed combining those.

Note that the light source of the detection unit 12 can perform actinic inspection by using an EUV light source with the same wavelength as an exposure wavelength. Note that the optical system, light source, camera or the like of the detection unit 12 is not particularly limited. Further, the detection unit 12 can switch between inspection with a low magnification and review by a high magnification.

The inspection room 15 and the preparation room 11 are vacuum, and their internal spaces are connected. Thus, the inspection room 15 and the preparation room 11 are internally connected vacuum chambers. In the preparation room 11, a reference mask 40, which is a reference sample, is contained. The reference mask 40 is placed on the support pins 13, just like the mask blank 30. As a matter of course, the mask blank 30 or the reference mask 40 may be placed on the stage, not on the support pins 13. The reference mask 40 is made of substantially the same material as the mask blank 30 and has substantially the same size as the mask blank 30.

Further, the reference mask 40 can be carried to the inspection room 15. When defect inspection of the mask blank 30 ends, the mask blank 30 is taken out of the inspection room 15. Then, after the mask blank 30 is carried, the reference mask 40 in the preparation room 1 is carried to the inspection room 15. For example, the reference mask 40 in the preparation room 11 is lifted from the support pins 13 and carried to the inspection room 15 by a vacuum carrier robot. The reference mask 40 carried into the inspection room 15 is placed on the support pins 13. Note that a method of carrying the mask blank 30 and the reference mask 40 is not particularly limited.

The processing device 20 controls the driving of the movable stage 14. Further, the processing device 20 performs processing on an inspection result in the inspection device 10 and measures defect coordinates. For example, the coordinates of a defect and marks are detected by performing image processing on a camera image. The position coordinates of a defect and marks in the inspection device 10 are referred to as detected coordinates. The detected coordinates are in the stage coordinate system of the movable stage 14. In other words, the detected coordinates are obtained on the basis of the driving position of the movable stage 14.

Then, the processing device 20 converts the detected coordinates into the coordinates of a reference mask coordinate system on the basis of the reference mask 40. Specifically, the defect coordinates measurement device calculates the defect coordinates in the reference mask coordinate system from the detected coordinates of a defect in the stage coordinate system. For that purpose, the processing device 20 includes a defect coordinates detection unit 21, a fiducial mark coordinates detection unit 22, an alignment mark coordinates detection unit 23, a reference mark extraction unit 24, a reference mark coordinates detection unit 25, and a defect coordinates calculation unit 26.

Figure 2:
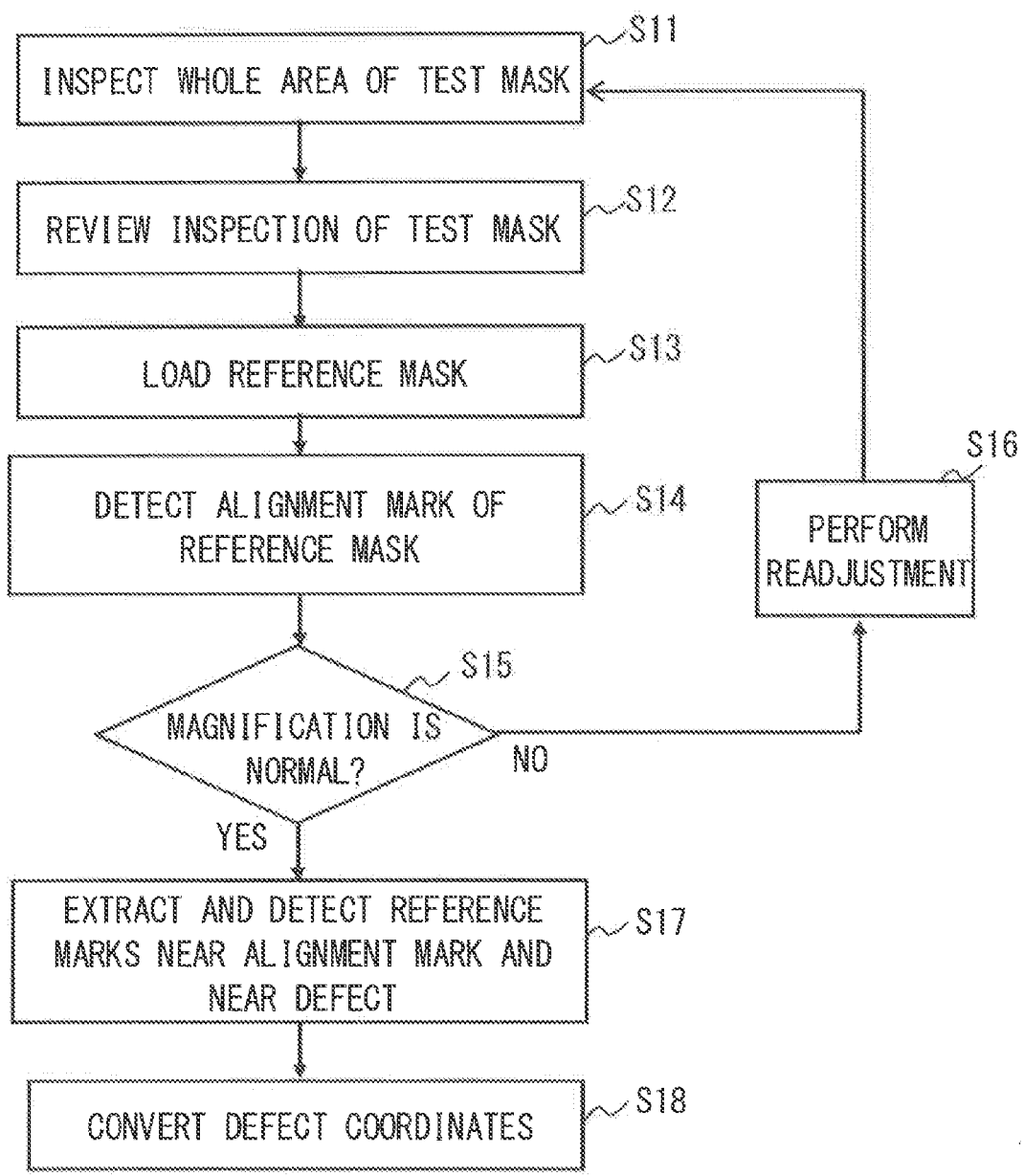
FIG. 2 is a flowchart showing a defect coordinates measurement method according to an embodiment.
Figure 3:
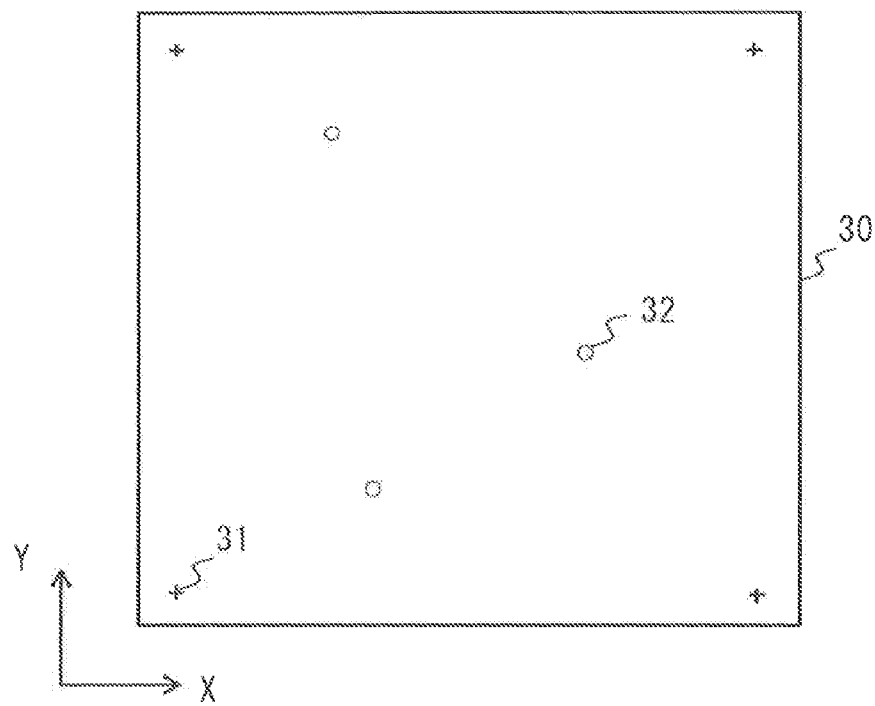
FIG. 3 is a plan view showing a structure of a test mask blank.
Figure 4:
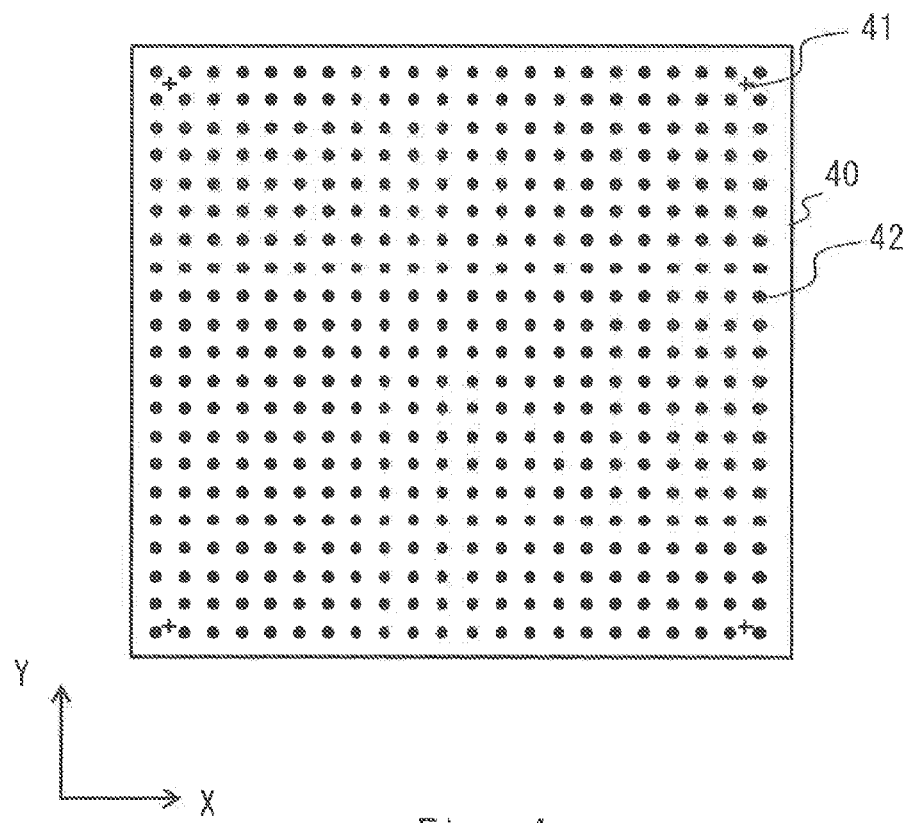
FIG. 4 is a plan view showing a structure of a reference mask.

Processing in the processing device 20 is described hereinafter with reference to FIGS. 1 to 8. FIG. 2 is a flowchart showing a defect coordinates measurement method. FIG. 3 is a plan view showing a structure of the mask blank 30. FIG. 4 is a plan view showing a structure of the reference mask 40. FIGS. 5 to 8 are views to describe processing in the processing device 20. Note that, in FIGS. 3 to 8, description is provided using an XY orthogonal coordinate system. In FIGS. 3 to 8, the crosswise direction in the plane of the mask blank 30 of the reference mask 40 is X direction, and the lengthwise direction is Y direction.

First, the whole area inspection of the mask blank 30, which is a test mask blank, is performed (Step S11). In this example, the whole area inspection of the mask blank 30 is performed with a low magnification. Specifically, images of the mask blank 30 are sequentially captured by moving the movable stage 14. Then, scattered light detection or the like is performed to detect a defect. Note that a method of the defect detection is not particularly limited. In the whole area inspection, inspection is carried out with a resolution of about 0.5 μm.

As shown in FIG. 3, a fiducial mark 31 is formed on the mask blank 30. In this example, cross fiducial marks 31 are formed respectively near the four corners of the mask blank 30. The position coordinates of the fiducial marks 31 on the mask blank 30 are known. Further, a defect 32 is present in the mask blank 30. The defect coordinates detection unit 21 and the fiducial mark coordinates detection unit 22 then detect the defect 32 and the fiducial marks 31, respectively. The rough detected coordinates of the fiducial marks 31 and the defect 32 are thereby detected. Note that the shape of the fiducial mark 31 is not limited to a cross, and it may be another shape such as a dot.

Next, the mode is switched to a high-magnification review mode, and the fiducial marks 31 and the defect 32 are reviewed at a high magnification (Step S12). Specifically, the vicinities of the fiducial marks 31 and the defect 32 detected in Step S11 are imaged at a high magnification. The detected coordinates of the fiducial marks 31 and the defect 32 are thereby detected accurately. In the high-magnification review mode, imaging is performed with a resolution of about 10 nm per pixel and with a viewing field of several μm to about 10 μm. As a matter of course, the detected coordinates of the fiducial mark 31 and the defect 32 are XY coordinates in the inspection device 10. Note that the detected coordinates of the defect 32 may be the coordinates on the basis of the detected coordinates of the fiducial marks 31.

Then, the reference mask 40 is loaded to the inspection room 15 (Step S13). Specifically, after taking the mask blank 30 out of the inspection room 15, the reference mask 40 is carried from the preparation room 11 to the inspection room 15. The reference mask 40 is thereby placed on the support pins 13 in the inspection room 15. Then, the alignment marks of the reference mask 40 placed on the support pins 13 are detected (Step S14). In this step also, after the rough alignment marks are detected by low-magnification inspection, the detected coordinates of the alignment marks are detected in the high-magnification review mode. The alignment mark coordinates detection unit 23 thereby detects the detected coordinates of the alignment marks with high accuracy.

When placing the reference mask 40 onto the support pins 13, the offset and rotation of the reference mask 40 occur. For example, the position and the rotation angle of the reference mask 40 and the mask blank 30 are slightly different due to a repeat accuracy or the like of the carrier robot. In the following process, the coordinates of a defect are measured with the offset and the rotation into consideration.

As shown in FIG. 4, alignment marks 41 are formed respectively near the four corners of the reference mask 40. In this example, the alignment mark 41 is cross-shaped. Note that, although the alignment mark 41 is cross-shaped just like the fiducial mark 31, it may be another shape.

Further, a plurality of reference marks 42 are formed on the reference mask 40. The reference marks 42 are arranged in an array. Specifically, the reference marks 42 are arranged at specified intervals both in the X-direction and the Y-direction. For example, the reference marks 42 are arranged at a pitch of 1 mm in the X-direction and the Y-direction. As a matter of course, pitches in the X-direction and the Y-direction may be different.

The reference marks 42 are arranged in an array within the four alignment marks 41. The reference marks 42 are further placed outside of the alignment marks 41. The reference mark 42 has a different shape from the alignment mark 41, and the reference mark 42 is circular-shaped in this example. Note that the coordinates of the reference marks 42 and the alignment marks 41 are known. For example, the reference coordinates are measured by a reference coordinates measurement machine which is different from the defect coordinates measurement device.

The shift amount in the X-direction, the shift amount in the Y-direction, the X-magnification, the Y-magnification, the slope of the X-axis, and the slope of the Y-axis are obtained from the detected coordinates of the alignment mark 41. For example, the shift amounts in the X-direction and the Y-direction and the slopes of the X-axis and the Y-axis are obtained from the detected coordinates of the fiducial mark 31 and the detected coordinates of the alignment mark 41. Further, it is determined whether the X-magnification and the Y-magnification calculated from the detected coordinates of the four alignment marks 41 are normal or not. As described above, the interval of the four alignment marks 41 is known from the reference coordinates of the alignment marks 41 measured in a reference coordinates measurement machine. For example, the interval of the alignment marks 41 in each of the X-direction and the Y-direction is predetermined from a measurement result in the reference coordinates measurement machine. Then, the interval of the alignment marks 41 in the reference coordinates and the interval of the alignment marks 41 in the detected coordinates are compared to thereby determine whether the X-magnification and the Y-magnification are normal.

When the X-magnification and the Y-magnification are deviated from normal values (NO in Step S15), it is estimated that the accuracy of coordinates detection is degraded due to temperature change, and therefore readjustment is requested (Step S16). For example, the mirror or the like of the detection unit 12 is adjusted to eliminate the deviation of the optical axis. Then, the magnifications are readjusted to normal values and then the process returns to Step S11.

When the X-magnification and the Y-magnification are normal (YES in Step S15), the reference marks 42 near the defect 32 and the reference marks 42 near the alignment mark 41 are extracted and detected (Step S17). In this example, the reference mark extraction unit 24 extracts the reference marks 42 that are in the vicinity of all the defects 32 from the plurality of reference marks 42 arranged in an array. Further, the reference mark extraction unit 24 extracts the reference marks 42 that are in the vicinity of all the alignment marks 41. Then, the reference mark coordinates detection unit 25 detects the detected coordinates of the extracted reference marks 42.

To be specific, for one defect 32, four reference marks 42 surrounding the defect 32 are extracted. Likewise, for one alignment mark 41, four reference marks 42 surrounding the alignment mark 41 are extracted. Then, the coordinates of all of the extracted reference marks 42 are detected. For example, assume that three defects 32 are detected in Steps S11 and S12. In this case, because four reference marks 42 are detected for each of the three defects 32 and the four alignment marks 41, the total 28 (7×4) reference marks 42 are extracted. Then, the reference mark coordinates detection unit 25 detects the extracted reference marks 42 in the high-magnification review mode.

Note that the reference mark extraction unit 24 extracts four reference marks 42 near the alignment mark 41 based on the detected coordinates of the alignment mark 41 that are detected in Step S14. Specifically, because the positional relationship of the alignment marks 41 and the reference marks 42 are known, the reference marks 42 near the alignment mark 41 can be reviewed quickly. The review is made by moving the movable stage 14 to the positions of the extracted reference marks 42. In other words, it is not necessary to detect the reference marks 42 other than the extracted reference marks 42. This reduces the measurement time.

Further, the reference mark extraction unit 24 extracts four reference marks 42 near the defect 32 based on the detected coordinates of the defect 32 and the detected coordinates of the reference marks 42 near the alignment mark 41. The reference marks 42 are arranged at regular intervals in the X-direction and the Y-direction. Thus, the positional relationship of the plurality of reference marks 42 is known. It is thereby possible to easily extract the reference marks 42 near the detected coordinates of the defect 32 based on the detected coordinates of the reference marks 42 near the alignment mark 41. The reference marks 42 near the detected coordinates of the defect 32 can be thereby reviewed quickly. Note that the reference marks 42 near the detected coordinates of the defect 32 may be extracted based on the detected coordinates of the alignment mark 41.

Figure 5:
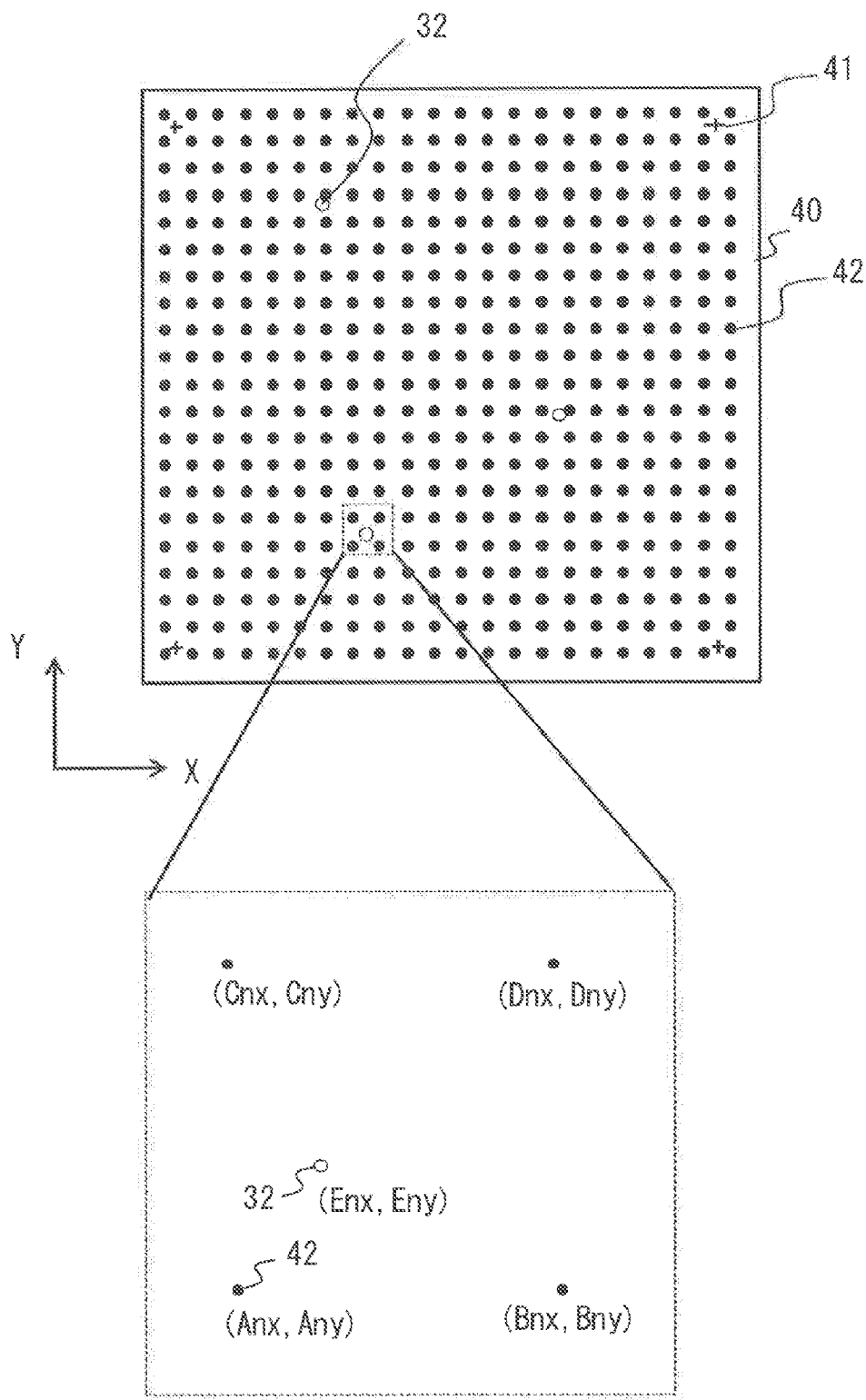
FIG. 5 is a view to describe a reference mask extraction process.

FIG. 5 is a view showing the defect 32 and the four reference marks 42 surrounding it in an enlarged scale. In FIG. 5, the defect 32 that is present in the mask blank 30 is shown superimposed on the reference mask 40. Further, in FIG. 5, the vicinity of one defect 32 is shown by a dotted line in an enlarged fashion.

For one defect 32, the nearest four reference marks 42 are extracted. Thus, the extracted four reference marks 42 form a reference grid. Specifically, the four reference marks 42 which are the nearest to the detected coordinates of the defect 32 are placed at the vertices of the rectangular reference grid. Because the intervals of the reference marks 42 in the X-direction and in the Y-direction are the same, the four reference marks 42 are placed at the vertices of a square. The defect 32 is placed within the reference grid.

As shown in FIG. 5, assume that the detected coordinates of the reference marks 42 that form the reference grid are (Anx,Any), (Bnx,Bny), (Cnx,Cny) and (Dnx,Dny), respectively. Further, the detected coordinates of the defect 32 within the reference grid is (Enx,Eny).

Then, the defect coordinates calculation unit 26 converts the detected coordinates of the defect 32 based on the coordinates of the four reference marks 42 (Step S18). The detected coordinates of the defect 32 are thereby converted into the coordinates in the reference mask coordinate system. The defect coordinates calculation unit 26 thereby calculates the coordinates of the defect 32 in the reference mask coordinate system from the detected coordinates of the reference marks 42. An example of this process is described hereinbelow.

Figure 6:
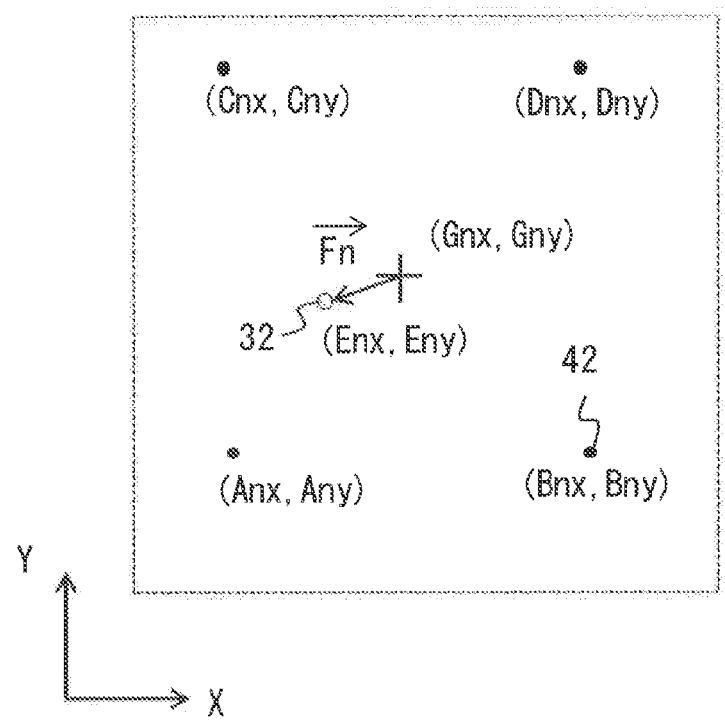
FIG. 6 is a plan view to describe positions of extracted reference marks and a defect.

First, the centroid (center of gravity) of the reference grid formed by the four reference marks 42 is calculated. When the coordinates of the centroid is (Gnx,Gny) as shown in FIG. 6, (Gnx,Gny) can be represented by the following equations (1):

$$Gnx=(Anx+Bnx+Cnx+Dnx)/4$$

$$Gny=(Any+Bny+Cny+Dny)/4 \qquad (1)$$

Then, when a position vector from the centroid (Gnx, Gny) to the detected coordinates (Enx,Eny) of the defect 32 is Fn, Fn can be represented by the following equations (2):

$$Fn=(Enx-(Anx+Bnx+Cnx+Dnx)/4, Eny-(Any+Bny+Cny+Dny)/4) \qquad (2)$$

Figure 7:
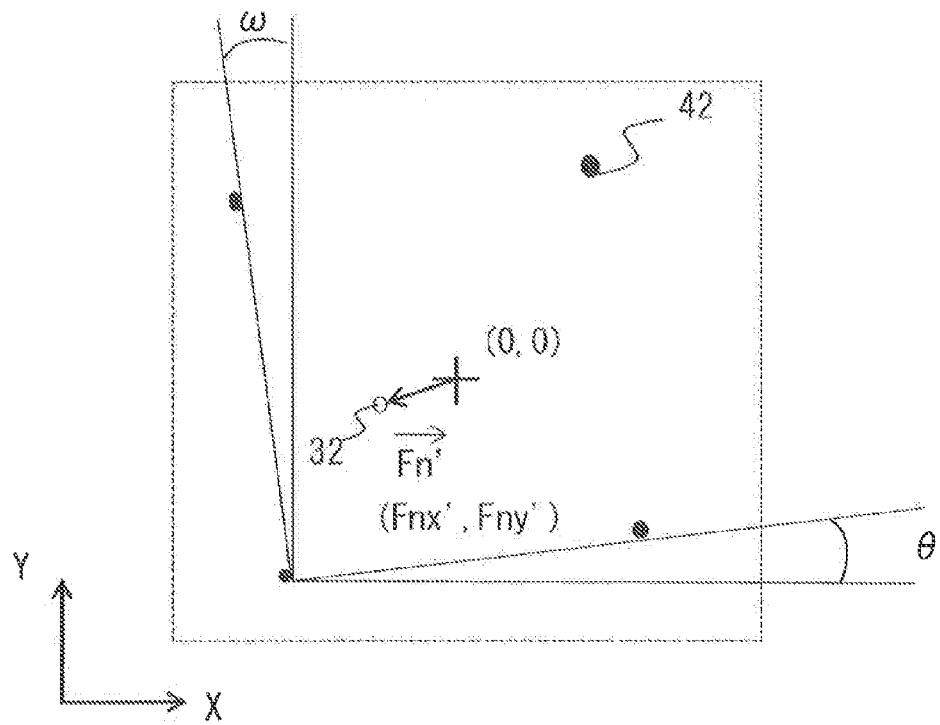
FIG. 7 is an enlarged plan view to describe displacement due to rotation of a reference mask.

The actual reference mask 40 rotates with respect to the stage coordinate system as shown in FIG. 7. Thus, the direction along which the movable stage 14 moves and the direction along which the reference marks 42 are arranged do not coincide. Accordingly, the coordinate system in the reference grid formed by the four reference marks 42 also rotates at the same angle. If the X-axis angle and the Y-axis angle are corrected based on the detection result in Step S14, the rotation correction and the orthogonality correction can be made. Note that the magnification correction is not needed because it is determined whether the magnification is normal or not in Step S15.

By the above process, the position vector Fn in the reference grid is converted into a position vector Fn' in the reference grid in the reference mask coordinate system. When the slope of the X-axis calculated in Step S14 is θ and the slope of the Y-axis is ω, the position vector Fn(Fnx,Fny) in the reference grid in the stage coordinate system can be converted into the position vector Fn'(Fnx',Fny') in the reference grid in the reference mask coordinate system by the following equation (3):

$$Fnx'=Fnx(1+\tan \omega)$$

$$Fny'=Fny(1+\tan \theta) \qquad (3)$$

Then, the defect coordinates in the reference mask coordinate system are calculated from the position vector Fn' in the reference grid in the reference mask coordinate system. It is assumed that i and j are sequence numbers of the reference grid. Specifically, the reference grid in which the defect 32 is present is the i-th grid in the X-direction and the j-th grid in the Y-direction. It is further assumed that Px and Py are set values of the reference grid pitch. Specifically, the interval of the reference marks 42 in the X-direction is Px, and the interval of the reference marks 42 in the Y-direction is Py. Then, the coordinates (Gjx,Gjy) of the centroid of the reference grid in which the defect 32 is present are represented by the following equation (4):

$$Gjx=iPx$$

$$Gjy=jPy \qquad (4)$$

Figure 8:
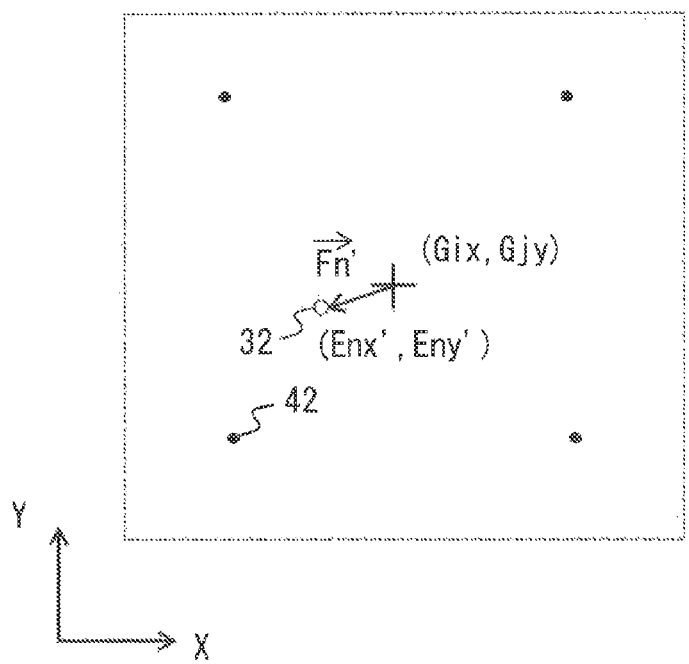
FIG. 8 is an enlarged plan view to describe coordinates of reference marks.

Accordingly, the defect coordinates (Enx',Eny') in the reference mask coordinate system can be calculated from the following equation (5) as shown in FIG. 8:

$$Enx'=Gix+Fnx'$$

$$Eny'=Gjy+Fny' \qquad (5)$$

As described above, the detected coordinates of the defect 32 can be converted into the defect coordinates in the reference mask coordinate system from the above equations (1) to (5). In this manner, some reference marks 42 are extracted from the reference marks 42 formed on the reference mask 40. This allows reduction of the number of the reference marks 42 to be detected, which shortens the measurement time. Further, the reference marks 42 on the reference mask 40 are detected immediately after performing the defect detection on the mask blank 30. This eliminates the need to maintain the accuracy of the stage coordinates for a long time. In other words, because the time interval between the detection on the mask blank 30 and the detection on the reference mask 40 is short, a temperature change or the like is small, allowing reduction of the actual accuracy degradation of the stage coordinates. It is thereby possible to reduce the effect of the accuracy degradation of the stage coordinates. The highly accurate measurement can be thereby achieved.

Further, the defect coordinates can be measured from the detection result of the four reference marks 42 surrounding the detect 32. Specifically, the defect coordinates are measured from the detected coordinates in the reference grid in close proximity to the defect coordinates. Thus, the straightness of the stage is substantially high, and the approximation of the linearity by a polynomial is not needed, and therefore an error due to the approximation does not occur, which improves the measurement accuracy.

Note that it is preferred to extract N (N is an integer of two or above) or more reference marks 42 for one defect 32. By extracting a plurality of reference marks 42 for one defect 32, error detection of the defect present on the reference mask 40 can be prevented. Specifically, even when there is a defect in close proximity to the detected coordinates of the defect 32 on the reference mask 40, it can be known that the defect is present on the reference mask 40 from the distance between the two reference marks 42. It is thus possible to reliably extract the nearest N number of reference marks 42, thus improving the accuracy. Further, if the four reference marks 42 surrounding one defect 32 are extracted, the measurement can be made with sufficient accuracy. Furthermore, by forming the reference marks 42 at regular intervals in the X-direction and the Y-direction, the coordinates of the reference marks 42 can be known.

Alternative Example

An alternative example of the coordinate conversion process is described hereinafter. In this alternative example, the coordinates are calculated by taking the displacement of the four reference marks 42 into consideration. In some cases the displacement of the reference marks 42 occurs due to the deformation or the like of the reference mask 40. In this case, the detected coordinates of the four reference marks 42 surrounding the defect 32 do not form a square. In this manner, in the case of taking the correction of distortion by a plurality of reference marks 42 into consideration, the following calculation method is used. Note that the process other than the coordinate conversion and the configuration are the same as above and not redundantly described.

Figure 9:
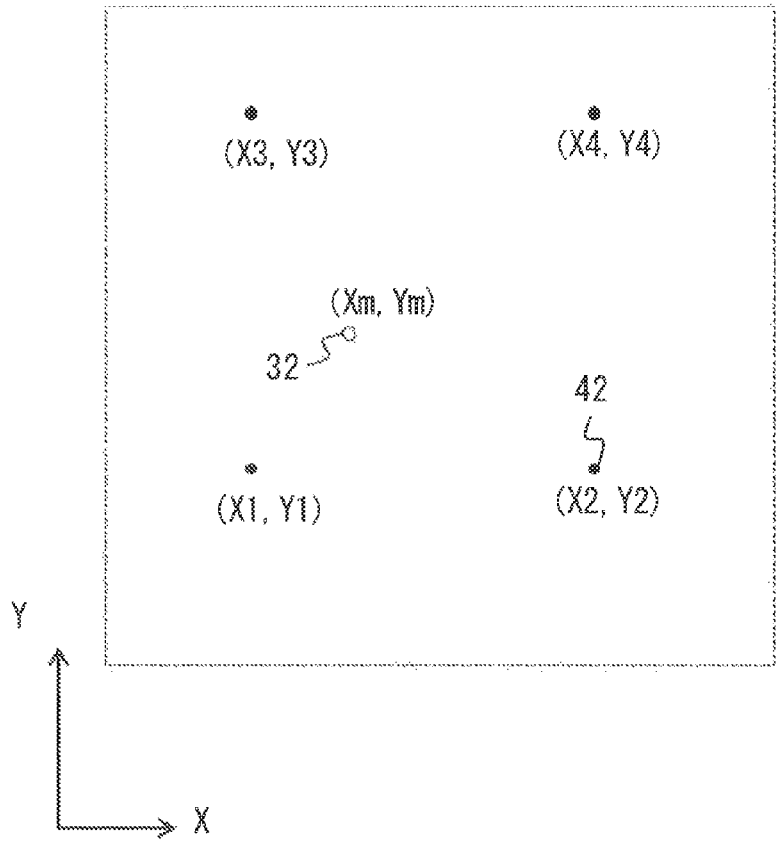
FIG. 9 is an enlarged plan view to describe a process according to an alternative example.
Figure 10:
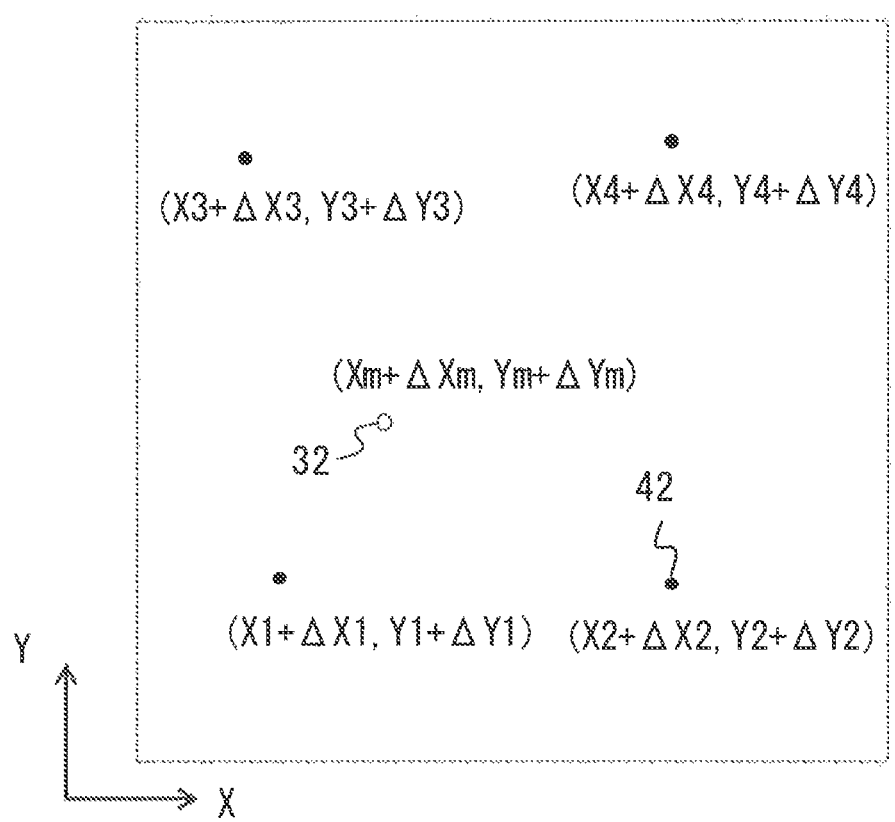
FIG. 10 is an enlarged plan view showing a state where displacement due to reference marks occurs.

First, as shown in FIG. 9, the accurate coordinate values of the reference marks 42 in the reference mask coordinate system are $(X_1,Y_1)$ to $(X_4,Y_4)$, and the accurate coordinate value of the defect 32 is $(X_m,Y_m)$. On the other hand, as shown in FIG. 10, the detected coordinates of the reference marks 42 are $(X_1+\Delta X_1,Y_1+\Delta Y_1)$ to $(X_4+\Delta X_4,Y_4+\Delta Y_4)$, and the detected coordinates of the defect 32 are $(X_m+\Delta Y_m,Y_m+\Delta Y_m)$. $\Delta X_1$ to $\Delta X_4$ and $\Delta Y_1$ to $\Delta Y_4$ are deviations between the accurate coordinate values and the observed values of the reference marks 42. $\Delta X_m$ and $\Delta Y_m$ are deviations between the accurate coordinate values and the observed values of the defect 32.

Because the accurate coordinate values $(X_1,Y_1)$ to $(X_4,Y_4)$ are known, $(\Delta X_1,\Delta Y_1)$ to $(\Delta X_4,\Delta Y_4)$ can be calculated by subtracting the accurate coordinate values $(X_1,Y_1)$ to $(X_4,Y_4)$ from the observed values of the reference marks 42. Then, based on the accurate coordinate values $(X_1,Y_1)$ to $(X_4,Y_4)$, the deviations $(\Delta X_1,\Delta Y_1)$ to $(\Delta X_4,\Delta Y_4)$, and the observed values $(X_m+\Delta Y_m,Y_m+\Delta Y_m)$ of the defect 32, the accurate coordinate values $(X_m,Y_m)$ are calculated as follows.

First, it is assumed that the defect 32 is present on the straight line connecting the upper two reference marks 42. Specifically, the case where an observation point is present between $(X_1,Y_1)$ and $(X_2,Y_2)$ is considered. In this case, when a value that makes linear interpolation of the deviation of the defect 32 is $\Delta X_{m1-2}$, the deviation $\Delta X_{m1-2}$ can be represented by the following equation (6):

$$\Delta X_{m1-2}=\Delta X_1+(\Delta X_2-\Delta X_1)\times(X_m-X_1)/(X_2-X_1)=\Delta X_1(X_2-X_m)/(X_2-X_1)-\Delta X_2(X_1-X_m)/(X_2-X_1) \quad (6)$$

The ratio of a distance from $(X_m,Y_m)$ to $(X_1,Y_1)$ and a distance from $(X_m,Y_m)$ to $(X_2,Y_2)$ is calculated. Further, a difference between $(\Delta X_1,\Delta Y_1)$ and $(\Delta X_2,\Delta Y_2)$ is calculated. Then, by multiplying the difference of the deviations and the ratio of the distances, the deviation $\Delta X_{m1-2}$ is obtained.

Likewise, it is assumed that the defect 32 is present on the straight line connecting the lower two reference marks 42. Specifically, the case where an observation point is present between $(X_3,Y_3)$ and $(X_4,Y_4)$ is considered. In this case, when a value that makes linear interpolation of the deviation of the defect 32 is $\Delta X_{m3-4}$, the deviation $\Delta X_{m3-4}$ can be represented by the following equation (7):

$$\Delta X_{m3-4}=\Delta X_3+(\Delta X_4-\Delta X_3)\times(X_m-X_3)/(X_4-X_3)=\Delta X_3(X_4-X_m)/(X_4-X_3)-\Delta X_4(X_3-X_m)/(X_4-X_3) \quad (7)$$

The ratio of a distance from $(X_m,Y_m)$ to $(X_3,Y_3)$ and a distance from $(X_m,Y_m)$ to $(X_4,Y_4)$ is calculated. Further, a difference between $(\Delta X_3,\Delta Y_3)$ and $(\Delta X_4,\Delta Y_4)$ is calculated. Then, by multiplying the difference of the deviations and the ratio of the distances, the deviation $\Delta X_{m3-4}$ is obtained.

The above-described linear interpolation is applied also to the Y-direction. Specifically, the case where the defect 32 is present between an observation point at $(X_1,Y_1)$–$(X_2,Y_2)$ and an observation point at $(X_3,Y_3)$–$(X_4,Y_4)$ is assumed. By the linear interpolation, the deviation in the X-direction $\Delta X_m$ can be represented by the following equation (8):

$$\Delta X_m=\Delta X_{m1-2}+(\Delta X_{m3-4}-\Delta X_{m1-2})\times(Y_m-Y_{1-2})/(Y_{3-4}-Y_{1-2})=\Delta X_1(X_2-X_m)/(X_2-X_1)\times(Y^3-Y_m)/(Y^3-Y_1)-$$
$$\Delta X_2(X_1-X_m)/(X_2-X_1)\times(Y_4-Y_m)/(Y_4-Y_2)-\Delta X_3(X_4-X_m)/(X_4-X_3)\times(Y_1-Y_m)/(Y_3-Y_1)+\Delta X_4(X_3-X_m)/(X_4-X_3)\times(Y_2-Y_m)/(Y_4-Y_2) \quad (8)$$

Note that, in the above equation (8), approximations $Y1 \approx Y2$ and $Y3 \approx Y4$ are made. Specifically, the deviation in the X-direction $\Delta X_m$ is calculated assuming $Y_{1-2}=Y1=Y2$ and $Y_{3-4}=Y3=Y4$.

Likewise, the deviation in the Y-direction $\Delta Y_m$ can be represented by the following equation (9):

$$\Delta Y_m=\Delta Y_{m1-2}+(\Delta Y_{m3-4}-\Delta Y_{m1-2})\times(X_m-X_{1-2})/(X_{3-4}-X_{1-2})=\Delta Y_1(X_2-X_m)/(X_2-X_1)\times(Y_3-Y_m)/(Y_3-Y_1)-$$
$$\Delta Y_2(X_1-X_m)/(X_2-X_1)\times(Y_4-Y_m)/(Y_4-Y_2)-\Delta Y_3(X_4-X_m)/(X_4-X_3)\times(Y_1-Y_m)/(Y_3-Y_1)+\Delta Y_4(X_3-X_m)/(X_4-X_3)\times(Y_2-Y_m)/(Y_4-Y_2) \quad (9)$$

Note that, in the above equation (9), approximations $X1 \approx X2$ and $X3 \approx X4$ are made. Specifically, the deviation in the Y-direction $Y_m$ is calculated assuming $X_{1-2}=X1=X2$ and $X_{3-4}=X3=X4$.

As described above, when the distortion of a plurality of reference marks 42 is large, measurement can be performed with high accuracy by using the above equations (8) and (9). Note that, when a measurement error of the reference marks 42 is larger, it is preferred to measure the coordinates by the equations (1) to (5).

Figure 11:
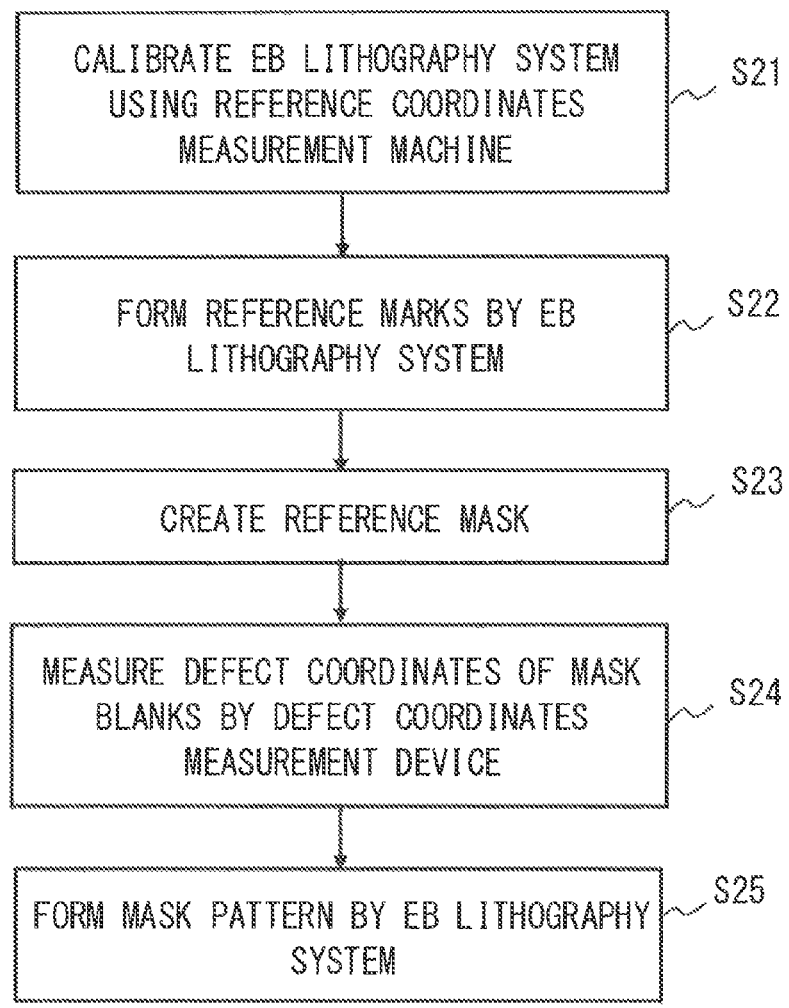
FIG. 11 is a flowchart showing a manufacturing method of a mask.

Hereinafter, a method of manufacturing a mask using the above-mentioned defect coordinates measurement method is described with reference to FIG. 11. FIG. 11 is a flowchart showing a mask manufacturing method. In the following, an example of manufacturing an EUVL mask having a MoSi multilayer film and an absorber is described.

First, an EB lithography system (mask writer) is calibrated using the reference coordinates measurement machine (Step S21). Specifically, the coordinate system in the EB lithography system is transformed into the coordinate system in the reference coordinates measurement machine. Then, reference marks are formed by the EB lithography system (Step S22). For example, a mask substrate is formed. The mask substrate in this example is preferably made of the same material as and in the same size as the substrate of the mask blank 30. Then, pits or bumps are formed at the positions to serve as the alignment marks 41 and the reference marks 42 of the mask substrate. For example, pits with the size of 30 nm to 50 nm and the height of 5 nm to 10 nm are formed.

Next, a multilayer film that reflects EUV light is formed thereon, thereby creating the reference mask 40 (Step S23). The multilayer film has a structure in which several tens of layers of molybdenum and silicon are stacked on top of each other, just like a multilayer film which is an EUVL reflection film. Thus, in the inspection device 10, the alignment marks 41 and the reference marks 42 are detected as a phase defect. Specifically, the reference mask 40 has the same layered structure as the mask blank, and, in the defect coordinates measurement device, the alignment marks 41 and the reference marks 42 are detected in the same manner as the defect 32 on the mask blank 30.

Then, the coordinates of the defect on the mask blank is measured by the defect coordinates measurement device (Step S24). In this example, the defect coordinates of the mask blank are measured according to the flowchart of FIG. 2. Specifically, after inspecting the whole area of the mask blank, which is the mask blank 30 to be inspected, some of the reference marks 42 are extracted from the reference mask 40 created in Step S23 and detected. The detected coordinates of the mask blank are then converted into the coordinates in the reference mask coordinate system. Note that the mask blank, which is the test mask blank 30, has the structure in which a multilayer film of molybdenum and silicon is formed on the mask substrate.

Figure 12:
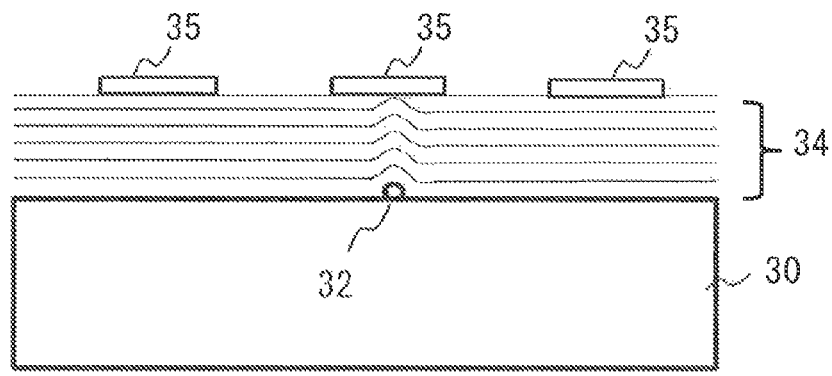
FIG. 12 is a side cross-sectional view showing a state where a defect is placed directly below an absorber.

After that, a mask pattern is printed by the EB lithography system on the mask blank on which the defect inspection has been made (Step S25). A pattern of an absorber that absorbs EUV light is formed using a resist pattern or the like. At this time, the EB lithography system forms the pattern so that the defect 32 is placed below an absorber 35 by mitigation as shown in FIG. 12. Specifically, the EB lithography system makes alignment so that all the defects 32 are covered by the absorbers 35. The EB lithography system carries out the alignment using the fiducial mark 31.

For example, the lithography pattern and the defect map are placed on top of one another, and the coordinate system of the lithography pattern is deviated so that the defect 32 is placed directly below the absorber 35. For example, the mask blank 30 is shifted vertically and horizontally or rotated from the reference position. It is thereby possible to prevent the defect 32 from being printed to a semiconductor wafer or the like. This reduces the effect of the defect 32 and it is thus possible to manufacture a semiconductor device with high productivity.

As described above, the coordinates of the defect 32 are measured in the reference mask coordinate system. Thus, a deviation due to measurement by the defect coordinates measurement device is reduced. Specifically, because the coordinates of the lithography pattern by the EB lithography system and the defect coordinates can be made consistent with each other, it is possible to increase the lithography accuracy of the EB lithography system for the defect 32. Because all defects can be reliably placed below the absorbers 35, it is possible to substantially prevent the occurrence of print defect in a semiconductor wafer.

Further, in Step S25, an EB lithography system that forms the pattern of the absorbers 35 is preferably the same as the EB lithography system that has formed the reference marks 42 in Step S22. It is thereby possible to reduce the deviation of the pattern by the EB lithography system. As a matter of course, the reference mask 40 and the mask blank 30 may be manufactured using different EB lithography systems as long as they are EB lithography systems calibrated using the same reference coordinates measurement machine. As a matter of course, a pattern drawing system other than EB lithography system may be used for forming a mask pattern on the mask blank.

Although the example in which the defect coordinates are measured during the manufacturing process of the EUV mask is described above, the above defect coordinates measurement method may be applied to a photomask different from the EUV mask. Further, the above defect coordinates measurement method may be applied to a sample other than the mask. It is thereby possible to perform measurement highly accurately with a simple method. Further, the inspection device of the defect coordinates measurement device is not limited to a review device that performs an inspection at a high magnification, and it may be an inspection device that performs an inspection automatically.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A defect coordinates measurement device configured to achieve a high stage coordinate accuracy without reliance on a temperature stabilization mechanism, the device comprising:
   a stage that receives a test sample;
   a detection unit that includes a photodetector configured to capture an image of the test sample;
   a driving mechanism configured to change a relative position of the detection unit and the test sample; and
   at least one processor configured to detect a defect of the test sample based on an image of the test sample, to detect coordinates of the defect based on a driving position of the driving mechanism and to convert the detected coordinates of the defect into a coordinate system in a reference sample,
   wherein the test sample has a fiducial mark, and wherein the test sample is used for a EUVL (Extreme Ultra-Violet lithograph) mask, a defect mitigation being implemented in the EUVL mask,
   the reference sample has at least one alignment mark and a plurality of reference marks,
   the plurality of reference marks are arranged in an array,
   each of the plurality of reference marks has a known position relative to the at least one alignment mark,
   the driving mechanism is configured to change a relative position of the detection unit and the test sample so that the photodetector captures a whole image of the test sample;
   the processor detects, as first detected coordinates, the detected coordinates of the defect on the basis of detected coordinates of the fiducial marks based on a first image included in the whole image of the test sample,
   the driving mechanism changes a relative position of the detection unit and the reference sample placed on the stage so that the photodetector captures a second image including the at least one alignment mark,
   the processor detects, as second detected coordinates, detected coordinates based on the second image;
   the processor extracts N reference marks nearest the first detected coordinates from the plurality of the reference marks based on the second detected coordinates, wherein N is an integer of two or more,
   the driving mechanism changes the relative position of the detection unit and the reference sample placed on the stage so that the photodetector captures a third image including the extracted N reference marks,
   the processor detects, as third detected coordinates, detected coordinates of the extracted N reference marks based on the third image, and
   the processor converts the first detected coordinate into the coordinates of the reference sample based on the third detected coordinates,
   wherein the step of converting the first detected coordinate into the coordinates of the reference sample based on the third detected coordinates is performed without construction of and reliance on a polynomial linearity model and consequent introduction of approximation error, thereby mitigating defect coordinate measurement error.

2. The defect coordinates measurement device according to claim 1, wherein the reference marks are arranged at regular intervals in each of two orthogonal directions.

3. The defect coordinates measurement device according to claim 1, wherein position coordinates of the fiducial mark on the test sample and the alignment mark on the reference sample are known.

4. A defect coordinates measurement method for increasing the accuracy of measurement of stage coordinates without reliance on a temperature stabilization mechanism, the method comprising:

capturing an image of a test sample by a photodetector included in a detection unit, the test sample being placed on a stage;

changing a relative position of the detection unit and the test sample by a driving mechanism so that the photodetector captures a whole image of the test sample;

detecting a defect of a test sample based on an image of the test sample by at least one processor, detecting coordinates of the defect based on a driving position of the driving mechanism by the processor;

converting the detected coordinates of the defect into a coordinate system in a reference sample by the processor, wherein the test sample has a fiducial mark, and wherein the test sample is used for a EUVL (Extreme Ultra-Violet lithograph) mask, a defect mitigation being implemented in the EUVL mask, the reference sample has at least one alignment mark and a plurality of reference marks, the plurality of reference marks are arranged in an array, each of the plurality of reference marks has a known position relative to the at least one alignment mark, the processor detects, as first detected coordinates, the detected coordinates of the defect on the basis of detected coordinates of the fiducial marks based on a first image included in the whole image of the test sample, the driving mechanism changes a relative position of the detection unit and the reference sample placed on the stage so that the photodetector captures a second image including the at least one alignment mark;

the processor detects, as second detected coordinates, detected coordinates based on the second image;

the processor extracts N reference marks nearest the first detected coordinates from the plurality of the reference marks based on the second detected coordinates, wherein N is an integer of two or more, the driving mechanism changes the relative position of the detection unit and the reference sample placed on the stage so that the photodetector captures a third image including the extracted N reference marks, the processor detects, as third detected coordinates, detected coordinates of the extracted N reference marks based on the third image, and the processor converts the first detected coordinate into the coordinates of the reference sample based on the third detected coordinates;

wherein the step of converting the first detected coordinate into the coordinates of the reference sample based on the third detected coordinates is performed without construction of and reliance on a polynomial linearity model and consequent introduction of approximation error, thereby mitigating defect coordinate measurement error.

5. The defect coordinates measurement method according to claim 4, wherein the reference marks are arranged at regular intervals in each of two orthogonal directions.

6. The defect coordinates measurement method according to claim 4, wherein coordinates of the fiducial mark on the test sample and the alignment mark on the reference sample are known.

7. A mask manufacturing method, the mask manufacturing method incorporating a method for increasing the accuracy of measurement of stage coordinates without reliance on a temperature stabilization mechanism, the mask manufacturing method comprising:

a step of measuring defect coordinates; and a step of forming a pattern on a mask blank so that the pattern is formed above the measured defect coordinates, wherein the step of measuring defect coordinates comprises;

capturing an image of a test sample by a photodetector included in a detection unit, the test sample being placed on a stage;

changing a relative position of the detection unit and the test sample by a driving mechanism so that the photodetector captures a whole image of the test sample;

detecting a defect of a test sample based on an image of the test sample by at least one processor, detecting coordinates of the defect based on a driving position of the driving mechanism by the processor;

converting the detected coordinates of the defect into a coordinate system in a reference sample by the processor, wherein the test sample has a fiducial mark, and wherein the test sample is used for a EUVL (Extreme Ultra-Violet lithography) mask, a defect mitigation being implemented in the EUVL mask, the reference sample has at least one alignment mark and a plurality of reference marks, the plurality of reference marks are arranged in an array, each of the plurality of reference marks has a known position relative to the at least one alignment mark, the processor detects, as first detected coordinates, the detected coordinates of the defect on the basis of detected coordinates of the fiducial marks based on a first image included in the whole image of the test sample, the driving mechanism changes a relative position of the detection unit and the reference sample placed on the stage so that the photodetector captures a second image including the at least one alignment mark, the processor detects, as second detected coordinates, detected coordinates based on the second image;

the processor extracts N reference marks nearest the first detected coordinates from the plurality of the reference marks based on the second detected coordinates, wherein N is an integer of two or more, the driving mechanism changes the relative position of the detection unit and the reference sample placed on the stage so that the photodetector captures a third image including the extracted N reference marks, the processor detects, as third detected coordinates, detected coordinates of the extracted N reference marks based on the third image, and the processor converts the first detected coordinates into the coordinates of the reference sample based on the third detected coordinates;

wherein the step of converting the first detected coordinate into the coordinates of the reference sample based on the third detected coordinates is performed without construction of and reliance on a polynomial linearity model and consequent introduction of approximation error, thereby mitigating defect coordinate measurement error.

8. The defect coordinates measurement method according to claim 7, wherein the pattern is formed on the mask blank using a pattern drawing system that forms the reference marks on the reference sample.

9. The mask manufacturing method according to claim 7, wherein the mask further comprises:
   a multilayer film that reflects EUV light, and
   an absorber that is placed on the multilayer film and absorbs EUV light, and wherein all defects are placed directly below patterns of the absorber.

\* \* \* \* \*